(12) United States Patent
Lai et al.

(10) Patent No.: US 6,546,526 B2
(45) Date of Patent: Apr. 8, 2003

(54) ACTIVE TRACE DEBUGGING FOR HARDWARE DESCRIPTION LANGUAGES

(75) Inventors: Ming-Chih Lai, Hsin-Chu (TW);
Chia-Huei Lee, Hsin-Chu (TW);
Bang-Hwa Ho, Hsin-Chu (TW);
Jien-Shen Tsai, Hsin-Chu (TW)

(73) Assignee: Springsoft, Inc., Hsin-Chu Hsien (TW)

( * ) Notice: Subject to any disclaimer, the term of this patent is extended or adjusted under 35 U.S.C. 154(b) by 259 days.

(21) Appl. No.: 09/764,396

(22) Filed: Jan. 19, 2001

(65) Prior Publication Data

US 2002/0100001 A1 Jul. 25, 2002

(51) Int. Cl.[7] ............................................. G06F 17/50
(52) U.S. Cl. ...................... 716/4; 716/5; 716/6; 703/14
(58) Field of Search ........................ 716/4–6; 703/13–17

(56) References Cited

U.S. PATENT DOCUMENTS

| | | | |
|---|---|---|---|
| 5,809,283 A | * 9/1998 | Vaidyanathan et al. | 395/500 |
| 5,991,533 A | * 11/1999 | Sano et al. | 395/500.49 |
| 6,389,586 B1 | * 5/2002 | McElvain | 716/18 |
| 6,421,251 B1 | * 7/2002 | Lin | 361/788 |
| 6,305,009 B1 | * 10/2002 | Goor | 717/4 |

OTHER PUBLICATIONS

Kadrovach et al, "Hardware Simulation Eith Software Modeling for Enhanced Architecure Performance Analysis," IEEE, 1998, pp. 454–461.*
Hartley et al, "A Synthesis, Test and Debug Environment for Rapid Prototyping of DSP Designs," IEEE, 1991, pp. 205–214.*
Vranken et al, "Debug Facilities in the Trimedia CPU64 Architecture," IEEE, May 1999, pp. 1–6.*
Vermeulen et al, "Silicon Debug of a Co–Processor Array for Video Applications," IEEE, Nov. 2000, pp. 47–52.*

* cited by examiner

Primary Examiner—Vuthe Siek
(74) Attorney, Agent, or Firm—Winston Hsu

(57) ABSTRACT

HDL code is used to describe a circuit in an HDL code debugger on a computer system. Circuit simulation data is obtained for the circuit, the simulation data being generated according to the HDL code. A circuit execution time is selected, and the simulation data should at least span the circuit execution time. A debugging element is selected, which is a circuit element in the circuit having a debugging state at the circuit execution time according to the simulation data. A target line of HDL code is then presented to a user. The target line of HDL code is the line of code responsible for setting the debugging element into the debugging state at the circuit execution time.

20 Claims, 8 Drawing Sheets

20

```
Process(n_q0,n_PC0,n_q2,ALU,IXR,mux_sel)
begin
    case mux_sel is
        When "000" : n_dout1 = n_q0;
        When "001" : n_dout1 = n_PC0;
        When "010" : n_dout1 = n_q2;
        When "011" : n_dout1 = ALU;
        When "100" : n_dout1 = IXR;
        When "101" : n_dout1 = "00000000";
        When "110" : n_dout1 = "00000000";
        When "111" : n_dout1 = "00000000";
        When others: n_dout1 = X = n_q0;
    end case;
end process;
```

```
76 ──▶  if(MUX_ENABLE==1)                        ──70e
              ⋮
           L12=060;            ──70d
                                                    ──70a
75 ──▶     case mux_sel is
              When "000" : n_dout1 =n_q0;
              When "001" : n_dout1 =n_PC0;
72c ──▶       When "010" : n_dout1 =n_q2;   ◀──
                                                ──70c
72a ──▶       When "011" : n_dout1 =ALU;    ◀──
                                                ──70b
              When "100" : n_dout1 =IXR;
              When "101" : n_dout1 = "00000000";
              When "110" : n_dout1 = "00000000";
              When "111" : n_dout1 = "00000000";
              When others: n_dout1 =X=n_q0;
           end case;
              ⋮
           L13=090;
        else
              ⋮
           L12=090;
74 ──▶     if(n_q2==11111111)
72b ──▶       n_dout1 =ALU;
           else
              n_dout1 =00000000;
           endif
        endif
```

Fig. 7

ACTIVE TRACE DEBUGGING FOR HARDWARE DESCRIPTION LANGUAGES

BACKGROUND OF THE INVENTION

1. Field of the Invention

The present invention relates to debugging hardware description language (HDL) code. Specifically, the present invention discloses a system and method that utilizes an active code tracing strategy to help a user locate faulty circuit designs.

2. Description of the Prior Art

With the gate counts and system complexity of circuit designs growing exponentially, engineers are spending more and more time on functional debugging. Debugging is now recognized as a critical step in the entire design and compilation process of complex circuitry. Indeed, the cost of debugging often dominates all other design expenses.

Hardware description languages (HDLs) are used to describe and model complex circuits, as debugging HDL code is considerably more efficient than the traditional methods of circuit schematics or in-circuit emulators. To date, however, it is the software industry that has presented the most comprehensive treatment of debugging. Little has been done in the hardware domain to address the debugging of ASICs and processors, even though such systems can be in excess of 10 million gates, and have correspondingly complex HDL code.

Engineers typically use HDL code to run simulations on a circuit design. Simulation results are compared to the design specifications to find any deviations. If any such deviations are found, the engineer must manually trace through the HDL source code to find the offending code that is responsible for the design flaw. This debugging process can be very difficult and tedious, especially if the engineer doing the debugging did not design the circuit. Although detecting the source of bugs is of critical importance, few methods have been proposed to assist an engineer in this task.

One of the simplest and most common methods for finding bugs is tracing. Please refer to FIG. 1 and FIG. 2. FIG. 1 is a diagram of a portion of a circuit 10. The diagram is presented to a user on a computer display as part of an HDL design package, and is a graphical representation of HDL source code that describes the circuit 10. FIG. 2 shows sample HDL source code for the circuit portion 10 of FIG. 1.

A circuit simulator (not shown) uses the portion of HDL source code 20, and a great deal of other code as well, to generate circuit timing data. In particular, the simulator will yield timing data for the circuit portion 10. By studying the timing data, an engineer may learn that the signal line n_dout1 12 goes into an improper state at a certain time. The engineer can click on the circuit portion 10, and the HDL design package will present the source code 20 in a different window on the display. To find the bug that is causing n_dout1 12 to go into an improper state, it is logical that the engineer exhaustively check every line of code that sets n_dout1 12. This is termed tracing. For example, if at a circuit execution time t=45, n_dout1 12 is equal to ALU 16, then, for the code 20, the engineer would know that line 22 is the line of code responsible for the state of n_dout1 12 at t=45. The engineer 30 must then determine if mux_sel 14 has an incorrect value of "011" at t=45, or if setting n_dout1 12 equal to ALU 16 is incorrect.

Although tracing in the tiny code fragment 20 is quite straightforward, the fact is that, in most circuit designs, hundreds of lines of code may be responsible for setting the state of n_dout1 12. That is, the line n_dout1 12 may be driven by many different signal lines at any given time, and hence there will be many different lines of source code that assign an assignment state to the element variable "n_dout1" 24. These lines of assignment can be scattered throughout the source code. Worse still, many of them may be identical. For example, there may be several lines of source code that state, 'n_dout1=ALU'. It is up to the engineer to parse the nested structures of the source code to determine which line is actually responsible for setting the value of "n_dout1" 24, and thus the state of signal line n_dout1 12. In any sufficiently complex circuit design, this process can turn into an enormously tedious and time-consuming task.

SUMMARY OF THE INVENTION

It is therefore a primary objective of this invention to provide a method and system for performing an active trace function to assist in finding lines of source code that are responsible for the state of a signal at a certain execution time.

The present invention, briefly summarized, discloses a method and corresponding system for assisting with debugging hardware description language (HDL) code in a debugger on a computer system. The HDL code is used to describe a circuit. Circuit simulation data is obtained for the circuit, the simulation data being generated according to the HDL code. A circuit execution time is selected, and the simulation data should at least span the circuit execution time. A debugging element is selected, which is a circuit element in the circuit having a debugging state at the circuit execution time according to the simulation data. A target line of HDL code is then presented to a user. The target line of HDL code is the line of code responsible for setting the debugging element into the debugging state at the circuit execution time.

It is an advantage of the present invention that by presenting the target line of HDL source code, an engineer can more quickly trace and track down bugs in the HDL source code that describes a circuit. Overall debugging time requirements are therefore reduced.

These and other objectives of the present invention will no doubt become obvious to those of ordinary skill in the art after reading the following detailed description of the preferred embodiment, which is illustrated in the various figures and drawings.

BRIEF DESCRIPTION OF THE DRAWINGS

FIG. 2 shows sample hardware description language (HDL) source code for the circuit portion of FIG. 1.

FIG. 7 shows portions of HDL source code.

DETAILED DESCRIPTION OF THE PREFERRED EMBODIMENT

Figure 1:
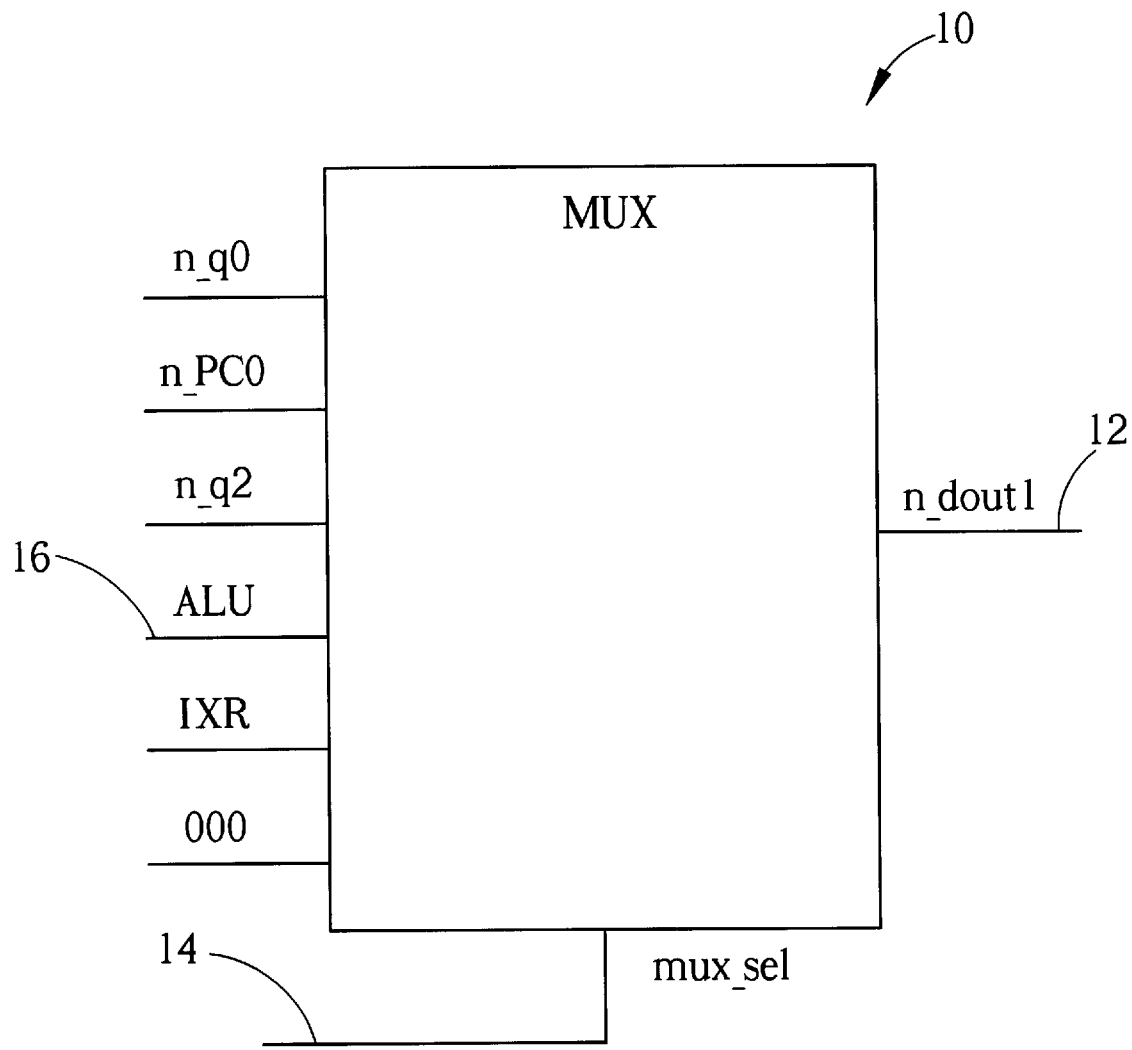
FIG. 1 is a diagram of a portion of a circuit.

The following is used as an example to illustrate the method of the present invention. Please refer to FIG. 3. FIG.

3 illustrates initial hardware description language (HDL) code debugging steps. HDL source code 30 is fed into a simulator 34 to generate simulation data 38. The HDL source code 30 is used to represent a circuit (not shown), and comprises a plurality of circuit state variables 32. The circuit state variables 32 are used to hold circuit state values, and each of these values represents the state of an element within the circuit. The HDL source code 30 also comprises a plurality of lines of assignment HDL code 33. Each line of assignment HDL code 33 is responsible for placing a circuit state value into a circuit state variable 32, and is thus responsible for evolving the overall state of the circuit. The simulator 34 executes the lines of assignment HDL code 33 in much the same way as a computer executes computer program code, and the changing circuit state values of the circuit state variables 32 represent the changing states of elements within the circuit. This evolution of the circuit state values within the circuit state variables 32 is stored as the simulation data 38.

The simulation data 38, in turn, can be plotted as timing diagrams for the various elements within the circuit. Please refer to FIG. 4 and FIG. 5, with reference to FIG. 3. FIG. 4 is a diagram of a portion 40 of the circuit represented by the HDL source code 30. FIG. 5 is a timing diagram 50 for some of the elements within the circuit portion 40 as obtained from the simulator 38. At a time t=45, as indicated by the dashed line in FIG. 5, a MUX_ENABLE signal line 45 is high, having a value of "1". An n_dout1 signal 42 has a value of "01101100". An n_q1 signal 43 has a value of "00001111". An ALU signal 46 has a value of "01101100", and a mux_sel signal 44 has a value of "011". Each of the signals 42, 43, 44, 45 and 46 has a corresponding circuit state variable 32 in the source code 30. In essence, the timing diagram 50 is simply a graph with time of the circuit state values held within the circuit state variables 32, which represent the signal lines 42, 43, 44, 45, and 46. The chronological evolution of the circuit state variables 32 are, in turn, dictated by the lines of assignment HDL code 33. Thus, at the time t=45, for each signal line 42, 43, 44, 45, and 46, there is a line of assignment HDL code 33 that is responsible for assigning the circuit state value to the respective circuit state variable 32 of each signal line 42, 43, 44, 45 and 46.

Figure 3:
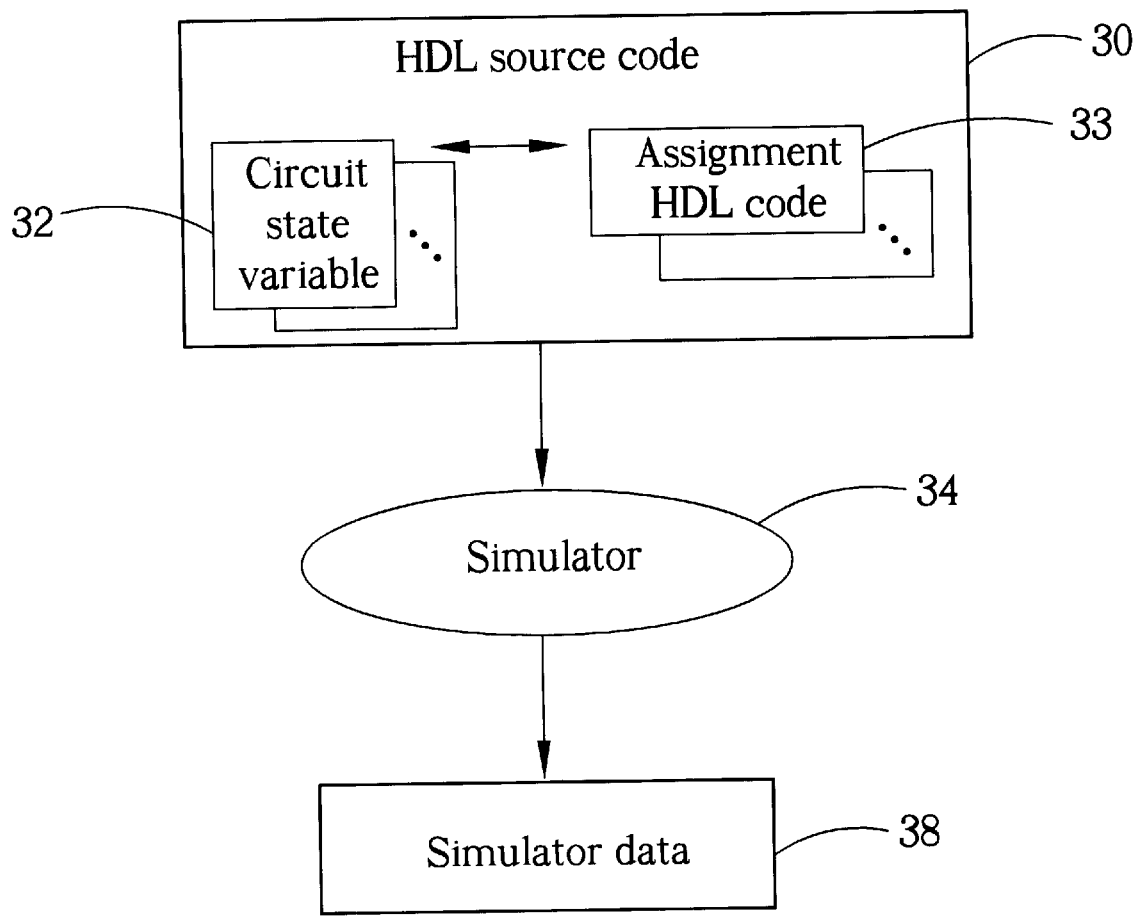
FIG. 3 illustrates HDL code debugging steps.
Figure 4:
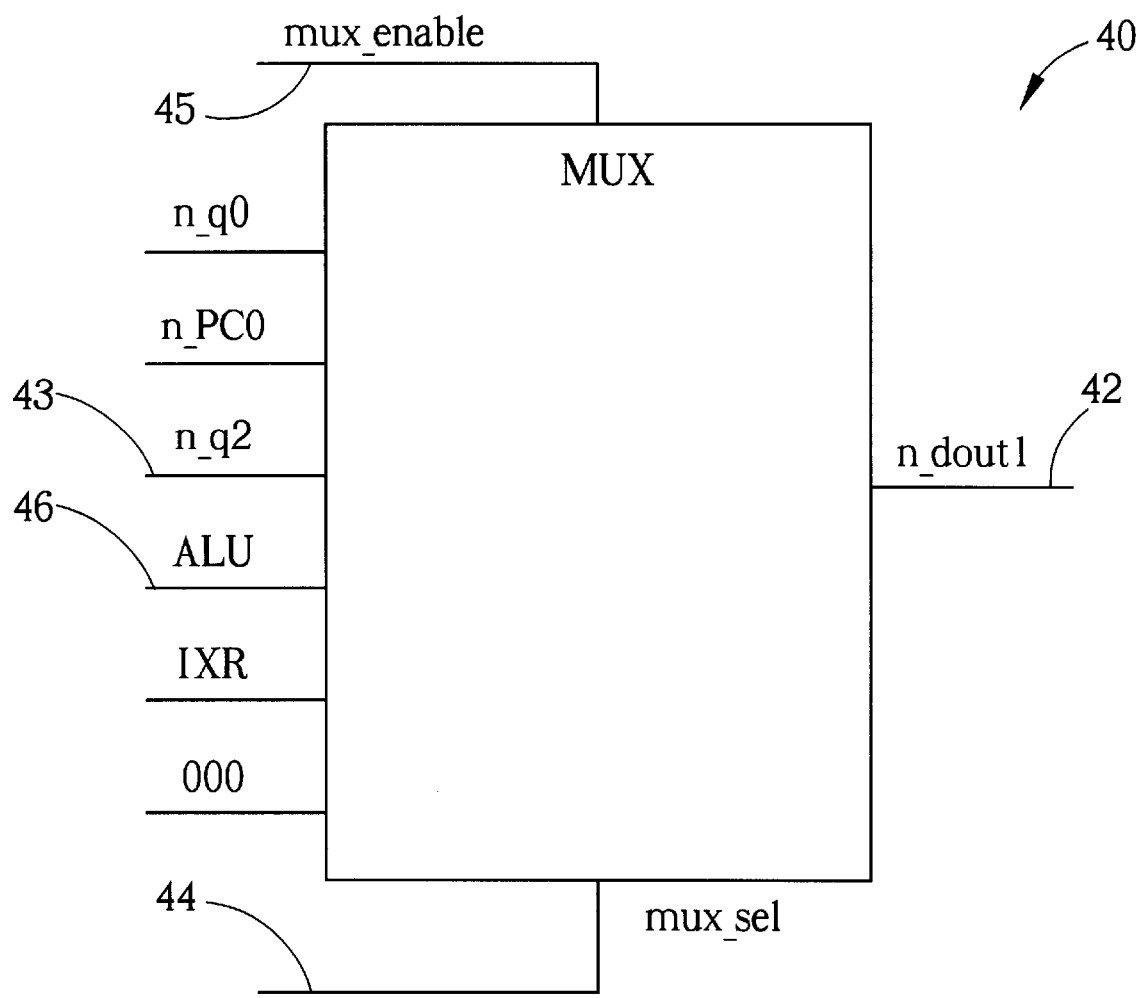
FIG. 4 is a diagram of a portion of a circuit represented by HDL source code in FIG. 3.
Figure 5:
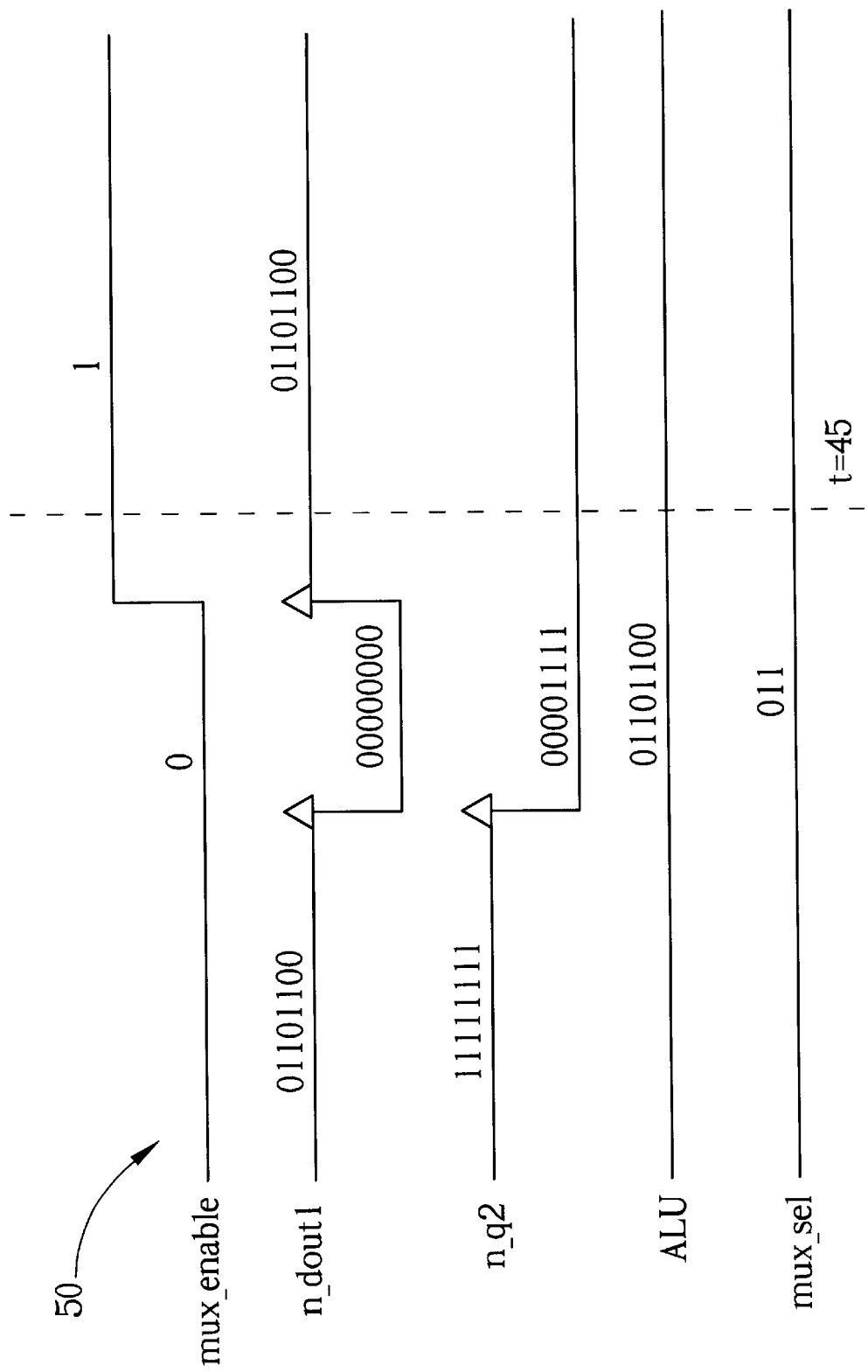
FIG. 5 is a timing diagram for some elements within the circuit of FIG. 4 as obtained from a simulator.
Figure 6:
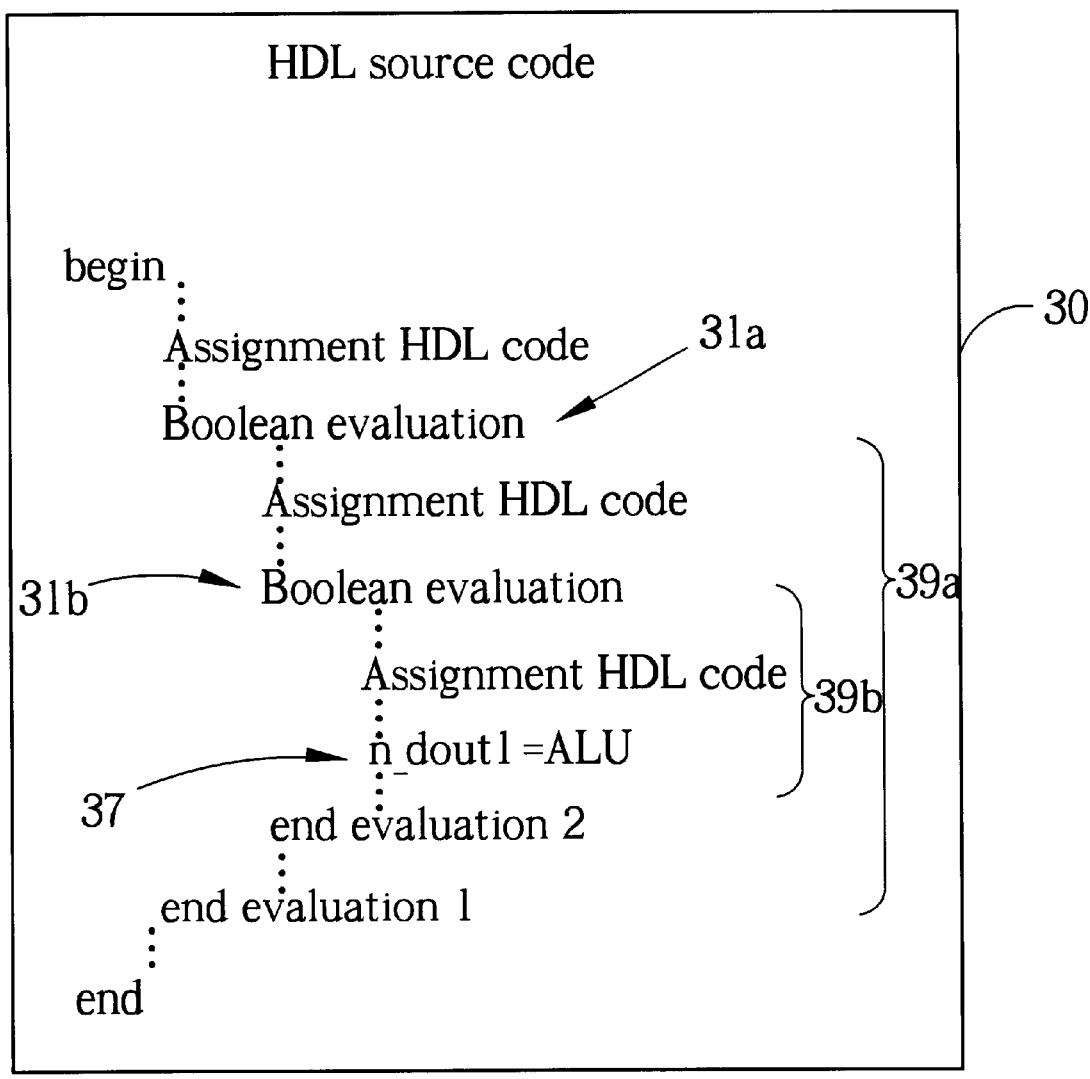
FIG. 6 illustrates a general structure of HDL source code.

Please refer to FIG. 6 with reference to FIGS. 3 to 5. FIG. 6 illustrates a general structure of the HDL source code 30. Like computer program code, the HDL source code 30 has a nested structure. For example, for any assignments within a nested structure 39a to occur, a Boolean evaluation 31a must evaluate to TRUE. For an assignment evaluation 37 to occur, which sets the signal n_dout1 42 equal to a current value of the signal ALU 46, both the Boolean evaluation 31a must be TRUE, and a Boolean evaluation 31b must be TRUE. Nested structure 39b is thus nested within the nested structure 39a. The active trace method uses a debugging element having a debugging state at a particular circuit execution time to present a target line of HDL code that is responsible for setting the state of the debugging element at the circuit execution time. For example, a user may desire to know which line of assignment HDL code 33 is responsible for setting the state of the circuit element n_dout1 42 at the time t=45 indicated by the dashed line in FIG. 5. The circuit element n_dout1 42 thus becomes the debugging element 42, and the time t=45 becomes the circuit execution time. At t=45, the debugging element n_dout1 42 has a value of "01101100", so "01101100" becomes a debugging state of the debugging element 42. Using the simulation data 38, the HDL source code 30 is parsed from innermost nested structures 39b to outermost nested structures 39a to find the target line of HDL source code. The target line of HDL source code will be a line of assignment HDL code 33 that sets the state of the debugging element 42 to the debugging state (i.e., "01101100"), and for which all relevant innermost and outermost Boolean evaluations 31a and 31b are TRUE. The target line of assignment HDL source code 33 is then presented on a display of a computer system that is being used to debug the HDL source code 30.

To better understand the above, please refer to FIG. 7 with reference to FIGS. 3 to 6. FIG. 7 shows portions of the HDL source code 30 that are being debugged with a debugger on a computer system (not shown). Using the timing diagram 50 of FIG. 5, as obtained from the simulation data 38 from the simulator 34, a user notices that the signal n_dout1 42 is incorrect at time t=45. The user thus selects n_dout1 42 as the debugging element 42, and t=45 as the circuit execution time. Of course, the circuit execution time t=45 must have been covered by the simulator 34, so that appropriate simulation data 38 is available at the circuit execution time t=45. In the method of the present invention, the simulation data 38 is used to find the debugging state of the debugging element 42 at the debugging time t=45. The debugging state is found to be "01101100", as shown in the timing diagram 50. Within the HDL source code 30, there exists a circuit state variable 32 that is responsible for holding the state of the debugging element n_dout1 42. This circuit state variable 32 is the element variable "n_dout1" 70a. An assignment subset is then generated which contains all the lines of HDL assignment code 33 that set the element variable "n_dout1" 70a to the debugging state "01101100". To do this, the simulation data 38 is used to find the circuit state values for the circuit state variables 32 at t=45, the circuit execution time. For example, at t=45, the circuit state variable "ALU" 70b, representing the state of ALU signal 46, has a circuit state value of "01101100". Circuit state variable "n_q2" 70c, on the other hand, representing the state of signal n_q2 43, has a circuit state value of "00001111" at t=45. The assignment subset thus includes the lines 72a and 72b, as the assignment of the element variable "n_dout1" 70b is equal to the debugging state "01101100", but does not include line 72c.

The lines of assignment HDL code 33 in the assignment subset are then parsed from their innermost structures to outermost structures to find the target line of assignment HDL code 33, using the simulation data 38 to compare circuit state variables 32 against their circuit state values at the circuit execution time t=45. For example, the line 72b is nested within Boolean evaluation 74. Boolean evaluation 74 is parsed and found to be FALSE for circuit state values at the circuit execution time t=45. That is, the circuit state variable "n q2" 70c is not equal to "11111111" at t=45, and so line 72b cannot be responsible for setting the debugging element "n_dout1" 70a to the debugging state "01101100". The Boolean evaluation at line 75 is TRUE, however, as the circuit state variable "mux_sel" is equal to "011" at the debugging time t=45. Furthermore, the Boolean evaluation 75 is nested within yet another Boolean evaluation 76. The Boolean evaluation 76 is also found to be TRUE as the circuit state variable "MUX_ENABLE" 70e is equal to "1" at t=45. The line 72a is thus presented to the user as the target line of HDL code 72a that is responsible for setting the debugging state "01101100" of the debugging element n_dout1 42 at the circuit execution time t=45.

Figure 8:
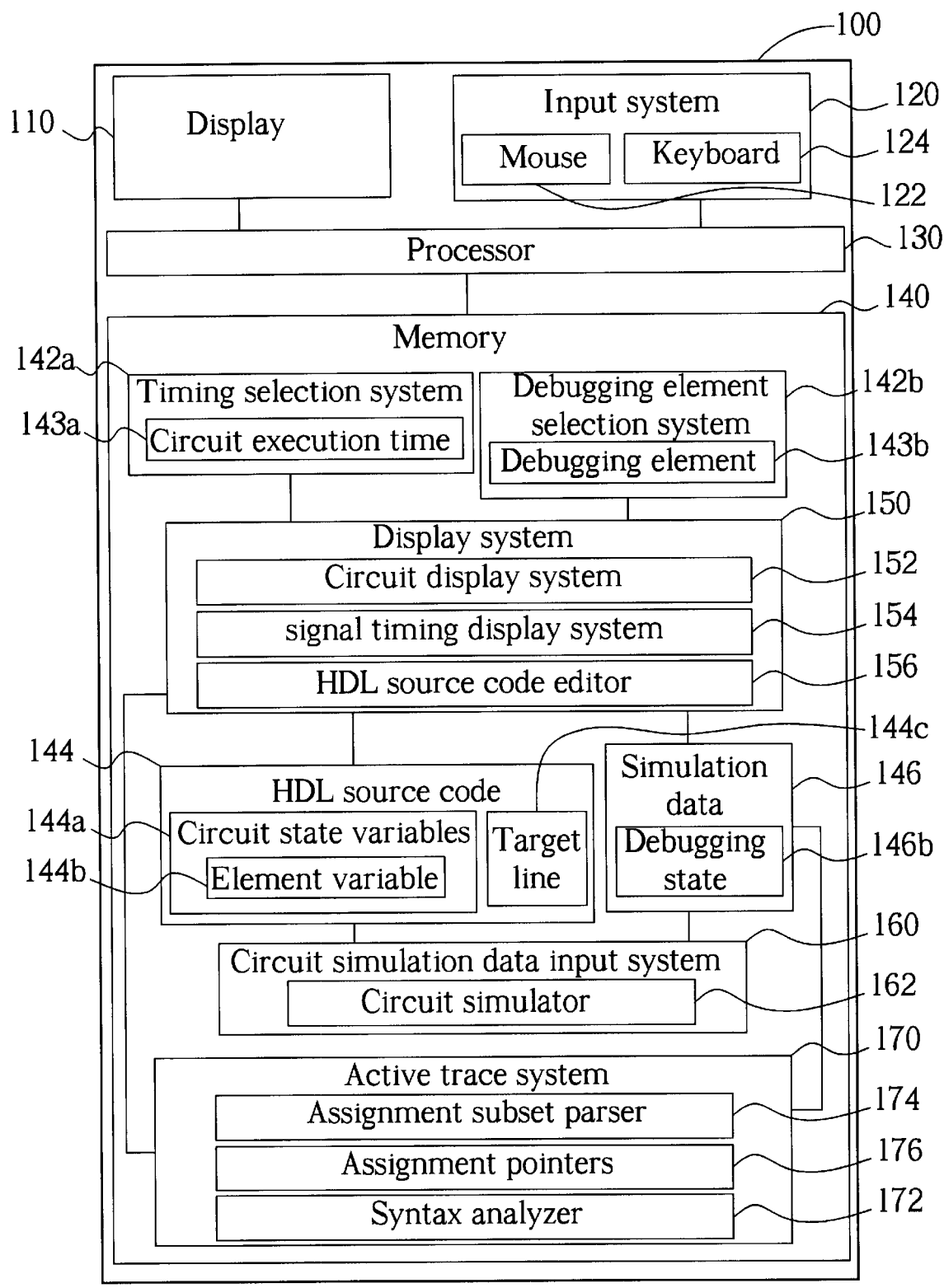
FIG. 8 is a function block diagram of a computer system that utilizes the active trace method of the present invention.

Please refer to FIG. 8. FIG. 8 is a function block diagram of a computer system 100 that utilizes the above-described active trace method of the present invention to assist a user in debugging HDL source code. The computer system 100 is used to design, develop and debug HDL source code. The computer system 100 comprises a display 110 for presenting visual information to the user, an input system 120 to enable the user to control the computer system 100, a memory 140 for storing code and data, and a processor 130 for executing the code stored in the memory 140. The memory 140 is a combination of both volatile working memory for the processor 130, and permanent storage memory. The input system comprises a mouse 122, and a keyboard 124. The memory 140 comprises a timing selection system 142a, a debugging element selection system 142b, a display system 150, HDL source code 144, simulation data 146, a circuit simulation data input system 160, and an active trace system 170.

The display system 150 comprises a circuit display system 152, a signal timing display system 154, and an HDL source code editor 156. The HDL source code editor 156 enables the user to use the display 110 and input system 120 to view and modify the HDL source code 144. The HDL source code 144 is used to describe a circuit. The circuit display system 152 analyzes the HDL source code 144 and presents a circuit diagram on the display 110 that corresponds to the circuit described by HDL source code 144. By using the mouse 122 and clicking on an element shown by the circuit display system 152, the user can be brought to corresponding HDL source code for that element within the HDL source code editor 156. The signal timing display system 154 graphically presents state timing diagrams of the circuit simulation data 146 to the user on the display 110. The user uses these state timing diagrams to note state changes of circuit elements defined by the HDL source code 144, and the times at which these state changes occur, and thereby find deviations from desired circuit characteristics.

The debugging element selection system 142b enables the user to use the input system 120 and a circuit diagram presented on the display 110 by the circuit display system 150 to select a debugging element 143b that is to undergo an active trace analysis. As noted previously, the HDL source code 144 comprises a plurality of circuit state variables 144a that are used to hold state information of the various elements within the circuit as described by the HDL source code 144. In particular, there is an element variable 144b that holds the state of the debugging element 143b. The timing selection system 142a utilizes signal timing information presented on the display 110 by the signal timing display system 154 to enable the user to select a circuit execution time 143a for the active trace analysis of the debugging element 143b.

The circuit simulation data input system 160 is used to generate the circuit simulation data 146. The circuit simulation data input system 160 may either import the circuit simulation data 146 from an external source, such as an output file generated by a separate circuit simulator, or it may generate the circuit simulation data 146 itself by way of a circuit simulator 162. The circuit simulator 162 analyzes the HDL source code 144 to generate the circuit simulation data 146. The simulation data 146 should span across the circuit execution time, and, in particular, contains the debugging state 146b of the debugging element 143b. The debugging state 146b is the value of the element variable 144b at the circuit execution time 143a.

Finally, of key importance to the present invention, is the active trace system 170. The active trace system 170 uses the circuit execution time 143a from the timing selection system 142a, the debugging element 143b from the debugging element selection system 142b and the related debugging state 146b from the simulation data 146, the HDL source code 144, the circuit simulation data 146 and the method of the present invention to find a target line 144c in the HDL source code 144 that is responsible for setting the element variable 144b to the debugging state 146b at the circuit execution time 143a. The active trace system 170 comprises an assignment subset parser 174 that generates assignment pointers 176. The assignment pointers 176 point to all lines in the HDL source code 144 that set the element variable 144b to the debugging state 146b, as determined from the simulation data 146 at the circuit execution time 143a. A syntax analyzer 172 uses the simulation data 146 and parses from innermost structures to outermost structures in the HDL source code 144 from the lines pointed to by the assignment pointers 176. That is, from a line of HDL source code 144 pointed to by an assignment pointer 176, and using the simulation data 146, the syntax analyzer finds successive Boolean evaluation lines within the HDL source code 144. Each Boolean evaluation line is evaluated, using the simulation data 146 at the circuit execution time 143a to determine if the Boolean evaluation line is TRUE at the circuit execution time 143a. The target line 144c in the HDL source code 144 is thus found that satisfies all Boolean evaluation conditions, as described previously, and which is thus the line of HDL source code 144 that last set the assignment state of the element variable 144b so that the element variable 144b would have the debugging state 146b at the circuit execution time 143a.

In contrast to the prior art, the present invention performs an active trace of a debugging element to present a target line of HDL source code to a user. The active trace method uses circuit simulation data, a circuit execution time and syntax analysis of the hierarchical, nested structure of the HDL source code to find the target line. The target line is the line of HDL source code that is responsible for setting the debugging element to its state at the circuit execution time. The user thus does not have to manually scan through numerous lines of source code seeking the target line, and debugging overhead costs are thereby reduced.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for assisting with debugging hardware description language (HDL) code in a debugger on a computer system, the HDL code being used to describe a circuit, the method comprising:
    obtaining simulation data for the circuit, the simulation data being generated according to the HDL code;
    selecting a circuit execution time, the simulation data at least spanning the circuit execution time;
    selecting a debugging element, the debugging element being a circuit element in the circuit having a debugging state at the circuit execution time according to the simulation data; and
    presenting at least a target line of HDL code, the target line of HDL code being responsible for setting the debugging state of the debugging element so that the debugging element has the debugging state at the circuit execution time.

2. The method of claim 1 wherein a user selects the circuit execution time.

3. The method of claim 1 wherein a user selects the debugging element.

4. The method of claim 1 wherein the HDL code comprises an element variable that is used to represent an element state of the debugging element, and the target line of HDL code is used to set the element variable to the debugging state.

5. The method of claim 4 further comprising generating an assignment subset from the HDL code, the assignment subset comprising portions of assignment HDL code, each portion of assignment HDL code being used to set the element variable to an assignment state.

6. The method of claim 5 wherein the assignment state is the debugging state.

7. The method of claim 5 further comprising using the circuit execution time, the simulation data and the assignment subset to parse the portions of assignment HDL code to find the target line of HDL code.

8. The method of claim 7 wherein the HDL code has a nested structure, and the portions of assignment HDL code are parsed from innermost structures to outermost structures to find the target line of HDL code.

9. The method of claim 8 wherein the HDL code comprises circuit state variables to hold circuit state values, and the circuit state values at the circuit execution time are compared against the circuit state variables when parsing the portions of assignment HDL code.

10. A computer system comprising:
a memory comprising:
hardware description language (HDL) source code, the HDL source code describing a circuit; and
simulation data of the circuit generated according to the HDL source code;
a timing selection system enabling a user to select a circuit execution time;
a debugging element selection system enabling the user to select a debugging element, the debugging element being a circuit element in the circuit;
a display system for presenting information to the user on a display; and
an active trace system for selecting a target line from the HDL source code and presenting the target line on the display;
wherein the debugging element has a debugging state at the circuit execution time according to the simulation data, and the target line of HDL code is responsible for setting the debugging state of the debugging element so that the debugging element has the debugging state at the circuit execution time.

11. The computer system of claim 10 wherein the HDL code comprises an element variable that is used to represent an element state of the debugging element, and the target line of HDL code is used to set the element variable to the debugging state.

12. The computer system of claim 11 further comprising an assignment subset parser, the assignment subset parser parsing the HDL source code and generating assignment pointers; wherein each assignment pointer indicates a location of assignment HDL code in the HDL source code, the assignment HDL code being used to set the element variable to an assignment state.

13. The computer system of claim 12 wherein the assignment state is the debugging state.

14. The computer system of claim 12 further comprising a syntax analyzer, the syntax analyzer using the circuit execution time, the simulation data and the assignment pointers to parse the portions of assignment HDL code to find the target line of HDL code.

15. The computer system of claim 14 wherein the HDL code has a nested structure, and the syntax analyzer parses the assignment HDL code from innermost structures to outermost structures to find the target line of HDL code.

16. The computer system of claim 15 wherein the HDL code comprises circuit state variables to hold circuit state values, and the syntax analyzer compares assignments of the circuit state variables in the HDL source code to corresponding values of the circuit state variables at the circuit execution time as obtained from the simulation data to find the target line of HDL code.

17. The computer system of claim 10 further comprising a circuit simulation data input system for placing the simulation data of the circuit into the memory.

18. The computer system of claim 10 further comprising a circuit simulator that uses the HDL source code to generate the simulation data.

19. The computer system of claim 10 wherein the display system presents a graphical representation of circuit timing information according to the simulation data, and the timing selection system uses the graphical representation of the circuit timing information to enable the user to select the circuit execution time.

20. The computer system of claim 10 wherein the display system presents a graphical representation of the circuit, and the debugging element selection system uses the graphical representation of the circuit to enable the user to select the debugging element.

* * * * *